United States Patent [19]

Wischermann

[11] Patent Number: 4,488,251
[45] Date of Patent: Dec. 11, 1984

[54] DIGITAL FILTER

[75] Inventor: Gerhard Wischermann, Darmstadt, Fed. Rep. of Germany

[73] Assignee: Robert Bosch GmbH, Stuttgart, Fed. Rep. of Germany

[21] Appl. No.: 370,089

[22] Filed: Apr. 20, 1982

[30] Foreign Application Priority Data

May 29, 1981 [DE] Fed. Rep. of Germany ....... 3121310

[51] Int. Cl.³ .................. G06F 7/38; G06F 15/31; H04N 3/24
[52] U.S. Cl. ..................................................... 364/724
[58] Field of Search .......................................... 364/724

[56] References Cited

U.S. PATENT DOCUMENTS

| | | | |
|---|---|---|---|
| 3,388,241 | 6/1968 | Isaacs | 364/724 X |
| 3,980,873 | 9/1976 | Mattei | 364/724 |
| 4,016,410 | 4/1977 | Eggermont | 364/724 |
| 4,356,558 | 10/1982 | Owen et al. | 364/724 |

OTHER PUBLICATIONS

Urkowitz, H., "Analysis and Synthesis of Delay Line Periodic Filters", *IRE Transactions on Circuit Theory*, Jun. 1957, pp. 41-53.

*Primary Examiner*—Jerry Smith
*Assistant Examiner*—Clark A. Jablon
*Attorney, Agent, or Firm*—Frishauf, Holtz, Goodman & Woodward

[57] ABSTRACT

A digital filter, in which $n+1$ sampled values of a digital signal are used for averaging, comprising means for delaying the input digital signal by $n+1$ sampling periods $\tau$ and means for subtracting the delayed signal from the undelayed signal. The difference values so formed are accumulated in an accumulator comprising an adder with a feedback path having a delay of one sampling period. Considerable simplification is obtained compared with conventional digital filters which use an adder with $n+1$ inputs.

10 Claims, 7 Drawing Figures

Fig. 6 - HIGH PASS

DIGITAL FILTER

The present invention relates to a digital filter.

BACKGROUND OF THE INVENTION

A digital filter is known is which n+1 consecutive sampled values of a digital signal are used for averaging purposes in such a way that the digital signal is subjected to n successive delays of one sampling period or cycle and the undelayed digital signal and the n delayed digital signals, in each case divided by n+1, are fed to n+1 inputs of an adding circuit. However, this known digital filter is very complicated, particularly due to the adding circuit which has a large number of inputs for large n. As the cut-off frequency of the filter is also dependent on the number of averaged sampled values, it is furthermore difficult to build adjustable filters constructed according to the known arrangement.

THE INVENTION

The digital filter operates upon n+1 consecutive sampled values of a digital signal. In accordance with the invention, the difference between each sampled value of the digital signal and that sampled value preceding the firstmentioned value by n+1 sampling periods is formed, and the differences so formed are accumulated.

Compared with the prior art filter, the digital filter according to the invention has the advantage that in the case of higher order filters (large n), the circuitry is much less complicated. In addition, it is possible to construct simple digital filters with a variable order or variable cut-off frequency.

BRIEF DESCRIPTION OF THE DRAWINGS

Embodiments of the invention will now be described by way of example with reference to the attached drawings, wherein:

FIG. 6 shows a digital filter according to the invention constructed as a high-pass digital filter.

DETAILED DESCRIPTION

Figure 1:
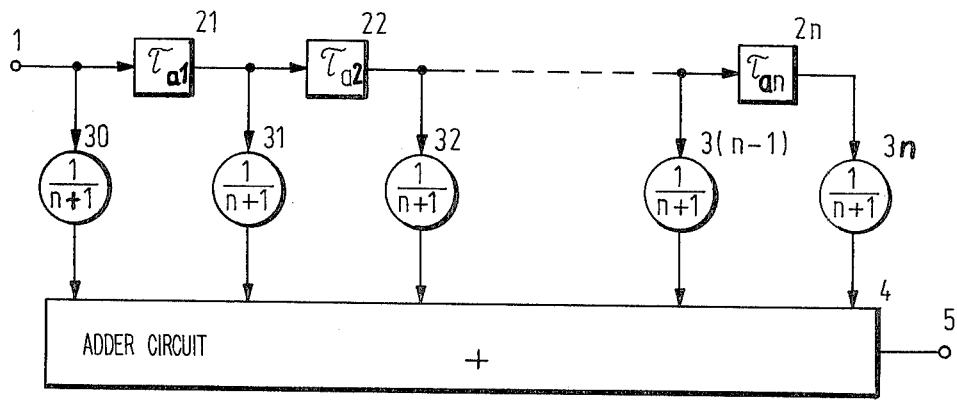
FIG. 1 is a block diagram of a known digital filter.

The digital signal to be filtered is supplied at input 1 to the prior art filter arrangement of FIG. 1. By means of a series of delay devices 21 to 2n the signal is subjected to n successive delays each of one sampling period or cycle $\tau$. The number of delay devices n is a function of the intended order of the filter. The filter shown in FIG. 1 is a low-pass filter, whose cut-off frequency is dependent on how many sampled values of the digital signal are averaged. For averaging the sampled values the undelayed signal, as well as the n delayed signals, are each initially divided by n+1 in dividing circuits 30 to 3n and supplied to n+1 inputs of an adder circuit 4. The filtered digital signal is then available at output 5. The function and technical implementation of such a filter is adequately described in the literature and therefore need not be explained in greater detail in conjunction with the present invention. The filter thus provides and defines a signal path between input 1 and output 5.

As stated hereinbefore, such a filter and in particular a higher order filter is very complicated due to the large number of dividing circuits 30, 31 ... 3n and the complicated adding circuit 4. This is particularly disadvantageous if the number n is to be adjustable.

Figure 2:
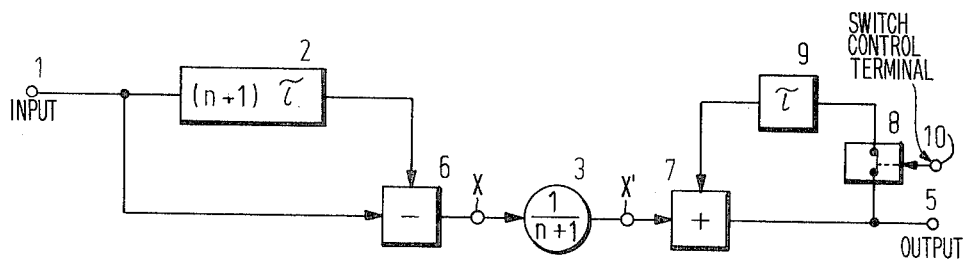
FIG. 2 is a block circuit diagram of an embodiment of a digital filter according to the present invention.

Such filters for digital signals can be used in the digital field in an analogous manner to the use of analog filters in the analog field, e.g. for controlling the frequency response of video, audio or other signals. Further, the filter according to the invention can be used advantageously for signal operations which are not possible by means of analog signal processing—e.g. the vertical or time relating low pass filtering of digital video signals. In such cases, instead of sampling clock delay devices, delay devices having delay times of line periods or field or frame periods have to be used. The block circuit diagram of FIG. 2 shows an embodiment of a digital filter according to the invention which fulfills precisely the same function as the known digital filter of FIG. 1, but which is much less complicated in construction. In FIG. 2, reference 1 is once again the input of the digital filter and reference 5 the output.

The signal supplied to the arrangement of FIG. 2 is fed on the one hand directly and on the other hand across a delay device 2 to first and second inputs respectively of a subtracting circuit 6 wherein the delayed signal is subtracted from the undelayed signal. The time delay of the device 2 is n+1 times the sampling period $\tau$ of the digital signal, so that each undelayed sampled value is present at the circuit 6 at the same time as the (n+1)th preceding sampled value. A circuit 3 for dividing by n+1 is connected between the output of the subtracting circuit 6 and one input of an adding circuit 7. The output of the adding circuit 7 is connected, optionally through a switch 8, subsequently to be described, to a delay device 9 which delays the output signal of the adding circuit 7 by one sampling period and feeds back the delayed signal to a second input of the adding circuit 7.

Together with the delay device 9 the adding circuit 7 constitutes an accumulator in which all the successively occurring sampled values are accumulated. However, due to the subtraction of the sampled values delayed by n+1 sampling periods from the undelayed sampled values in the subtracting circuit 6, the running total in the accumulator is the sum of n+1 sampled values or, after taking account of the effect of the dividing circuit 3, the mean value of n+1 sampled values. It is to be understood that the value n is adjustable for the delay device 2 and dividing circuit 3 of FIG. 2.

The accumulator formed by adding circuit 7 and delay device 9 could overflow if, as a result of interference in the subtracting circuit 6 for example, the sampled values which are subtracted after a delay of n+1 sampling periods in the device 2 are not precisely the same as those previously added in undelayed form in the adder 7. It has therefore proved advantageous, e.g. when using the digital filter for digital television signals, to reset the accumulator at cyclic intervals, in particularly within each line frequency blanking interval. This can, for example, be brought about by providing the controllable switch 8 between the output of the adding circuit 7 and the input of the delay device 9. The switch 8 normally completes the connection between the output of the adder 7 and the input of the delay device 9, but by means of a pulse supplied at 10 the switch is briefly brought into the non-conductive state during the line frequency blanking interval.

The filter shown in FIG. 2 has the following transient response:

$$H(f) = 1/(n+1) \cdot \sin(n+1)\pi\tau f / \sin \pi\tau f$$

for the amplitude, and $$tg(f) = n \cdot \text{constant}$$

for the envelope delay.

However, these frequency responses have a relatively poor attenuation behaviour in the stop band (approximately 10 dB). The series connection of two filters of order n and n+1 leads to better results, as will be described later. In this way, a non-pass attenuation of min. 26 dB can be obtained.

Figure 3:
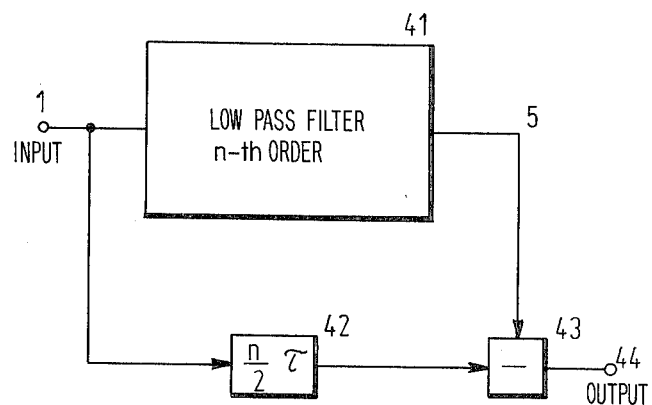
FIG. 3 shows a circuit for digital aperture correction representing a further development of the digital filter according to the invention.
Figure 3:
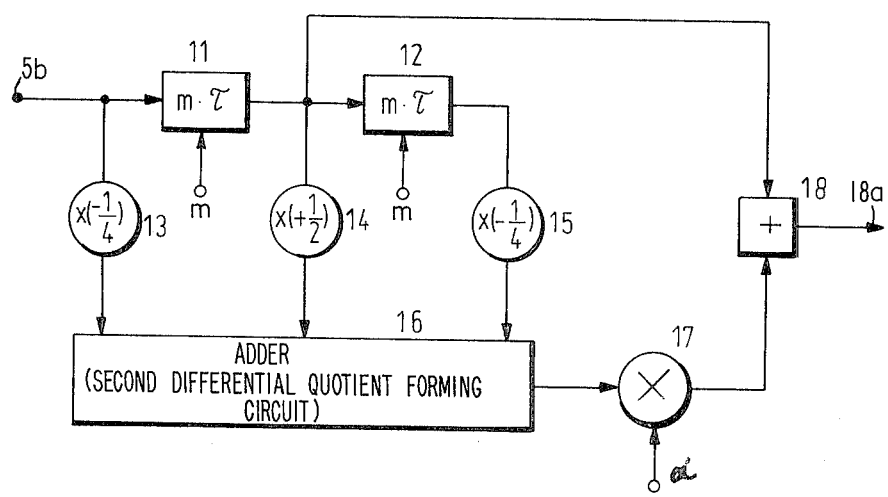

Furthermore, by connecting a digital aperture correction circuit to the output of the filter or filters the overall filter characteristic can be improved in such a way that there is a steeper transition from the pass band into the stop band, and FIG. 3 shows a circuit for such aperture correction.

FIG. 3 shown an aperture corrector with delay line, which adds the input signal from a terminal 5b, corresponding, for example, to the signal at terminal 1 to the second differential quotient. The digital signal is passed across two series-connected delay devices 11, 12, each providing an adjustable delay of m times the sampling period $\tau$, and the delayed and undelayed signals are each weighted by a factor of $(-\frac{1}{4})$ or $(+\frac{1}{2})$ in multipliers 13, 14 and 15 as shown. From the weighted signals an adder 16 forms the second differential quotient whose amplitude can be adjusted with the aid of a variable multiplier 17 and to which the original signal is added in an adder 18, having an output terminal 18a after a delay of m·$\tau$ in the device 11. The size of the aperture or the frequency response rise is adjusted by means of the variable multiplier factor $\alpha$, and the frequency range in which the rise is to take place can be adjusted by adjusting m for the delay devices 11 and 12.

Figure 4:
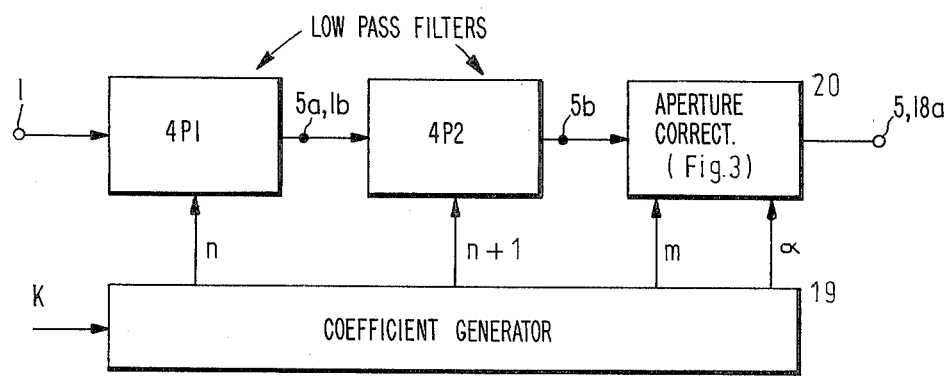
FIG. 4 shows a circuit with a plurality of digital filters according to the invention.
Figure 5:
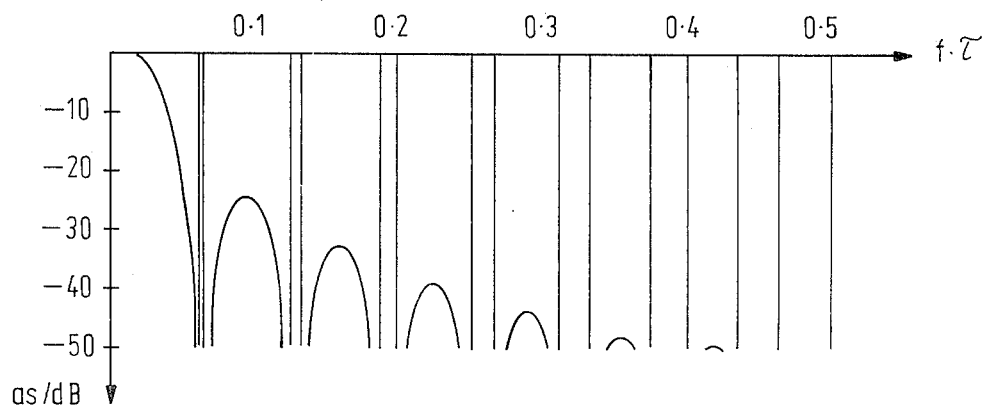
FIG. 5 shows the frequency response of a practical arrangement according to FIG. 4.

FIG. 4 shows a circuit arrangement comprising two low-pass filters LP1 and LP2 of order n and n+1 and an aperture correction circuit 20 of the kind shown in FIG. 3. Output terminal 5a of the first filter LP1 is connected to input terminal 1b of the second filter LP2, connected to the input of circuit 20, as shown. As a function of the number K, a coefficient generator 19 produces the coefficients n, (n+1), m and $\alpha$ necessary for filter control purposes. As an example FIG. 5 shows the frequency response for the following parameters: n=14, n+1=15, m=16, $\alpha=\frac{1}{3}$.

By subtracting the output signal of the low-pass filter described above from the appropriately delayed input signal, the invention also permits the implementation of a high-pass filter. Thus, FIG. 6 shows a high-pass filter in which a digital signal at an input 1 is supplied both to an nth order low-pass filter 41 of the kind shown in FIG. 2 and to a delay device 42 in which the input signal is delayed by n/2·$\tau$. The output signal of the low-pass filter 41 is subtracted from the output of the delay device 42 in a subtracting circuit 43. The signal thus available at the output 44 has its components below the cut-off frequency of the low pass filter 41 suppressed.

It is to be appreciated that in FIG. 2 the dividing circuit 3 could be connected to the output of the accumulator 7, 9 (i.e. immediately before the filter output 5) rather than, as shown, between the subtracting circuit 6 and the adder 7.

Figure 2A:
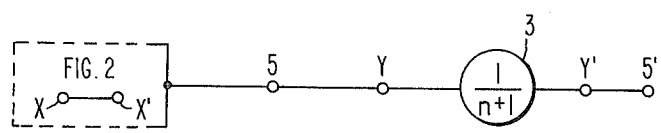
FIG. 2a is a fragmentary circuit diagram showing a modification.

FIG. 2a shows this modification, in which points X—X' in the circuit of FIG. 2 are cross-connected, and the output 5 of the circuit of FIG. 2 is connected to point Y, then through element 3 to the point Y', and then to the final output terminal 5'. In either case the effect is to divide the accumulated total by n+1. Indeed, the division by n+1 can be effected at any convenient point in the processing and need not be immediately associated with the filter itself.

I claim:

1. A digital filter which operates upon n+1 consecutive sampled values of a digital signal, the filter defining a signal path from an input (1) to an output (5, 5') comprising
    means (6) for forming the difference between each sampled value of the digital signal applied to the input (1), and that sampled value preceding the first-mentioned by n+1 sampling periods;
    means (7, 9) for receiving the so-formed differences and for accumulating the so-formed differences and applying said accumulated difference to an output (5),
    wherein the difference-forming means (6) comprises means for connecting the input (1) of the digital filter via a first path to a first input of a subtracting circuit (6) and via a second path having a delay of n+1 sampling periods relative to the first path to a second input of the subtracting circuit (6),
    wherein the accumulating means (7, 9) comprises an adding circuit (7) having a first input connected to the output of the subtracting circuit (6) and a second input connected to the output of the adding circuit via a path (9) providing a delay of one sampling period, the output from the adding circuit also forming the output (5, 5') of the filter;
    and dividing means (3) connected in the signal path of the filter between the input (1) and the output (5, 5') for dividing the said accumulated differences by n+1.

2. A digital filter according to claim 1, wherein the dividing means is connected between the difference-forming means (6) and the accumulating means (7, 9).

3. A digital filter according to claim 1, wherein the dividing means is connected to the output (5) of the accumulating means (7, 9).

4. A digital filter according to claim 1, forming a high-pass filter, further including
    a time delay circuit (42) connected to receive the input signal and time delaying the input signal by a value of n/2×$\tau$
    wherein $\tau$ is the sampling period of the signal and providing time-delayed input signals; and
    means (43) for forming the difference between the time-delayed input digital signal and the output of the accumulating means (7,9) connected to receive the time-delayed input signal and the output of the accumulating means,
    the high-pass filtered output (43) being connected to the output of the difference-forming means (43).

5. A digital filter according to claim 1, forming a high-pass filter, wherein a first input of a further subtracting circuit (43) is connected to the output (5) of the adding circuit (7) in the accumulating means (7, 9) and a second input of the further subtracting circuit (43) is connected through a delay circuit (42) to the input (1) of the digital filter (1), the output (44) from the subtracting circuit (43) supplying the high-pass filtered output.

6. A digital filter according to claim 1, wherein the integer n is adjustable.

7. A digital filter according to claim 1, further including switching means (8, 10) connected to the accumulating means (7, 9) for resetting the accumulating means at chosen intervals.

8. A digital filter comprising a plurality of filters according to claim 1, connected in series, and having different values for n.

9. A digital filter according to claim 1, including a digital aperture correction circuit comprising circuit means (16) for forming the second differential quotient connected to the output (5) of the digital filter, and a further adding circuit (18) connected in series with the filter output (5) and the output of the second differential quotient-forming circuit means (16), the output (18a) of the further adding circuit forming the output of the aperture correction circuit.

10. A digital filter according to claim 1, for use in filtering digital television signals, further including controlled switching means (8, 10) connected to the accumulating means (7, 9) for resetting the accumulating means;

and a control connection (10) for the controlled switching means applying to the switching means resetting signals in synchronism with line blanking pulses of the television signal, to reset the accumulating means at recurring intervals corresponding to line blanking of the television signal.

* * * * *